US006319372B1

(12) United States Patent
Delaunay

(10) Patent No.: US 6,319,372 B1
(45) Date of Patent: Nov. 20, 2001

(54) PERMANENT MAGNET LINEAR MICROWAVE PLASMA SOURCE

(75) Inventor: Marc Delaunay, Meylan (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/229,575

(22) Filed: Jan. 13, 1999

(30) Foreign Application Priority Data

Jan. 26, 1998 (FR) .................................................. 98 00777

(51) Int. Cl.$^7$ ................................................. C23C 14/34
(52) U.S. Cl. ............................... 204/298.16; 204/298.09; 204/298.17; 204/298.04; 204/192.11
(58) Field of Search ......................... 204/298.09, 298.12, 204/298.16, 298.17, 298.18, 298.19, 298.04, 192.11; 156/345

(56) References Cited

U.S. PATENT DOCUMENTS

| | | | |
|---|---|---|---|
| 4,610,770 | * 9/1986 | Saito et al. | 204/298.16 |
| 4,911,814 | * 3/1990 | Matsuoka et al. | 204/298.16 |
| 5,266,146 | * 11/1993 | Ohno et al. | 156/345 |
| 5,302,266 | 4/1994 | Grabarz et al. | 204/192.12 |
| 5,531,877 | 7/1996 | Latz et al. | 204/298.19 |
| 5,726,412 | * 3/1998 | Briffod et al. | 204/298.16 |

FOREIGN PATENT DOCUMENTS 42 30 291    3/1994   (DE) .
5-266993   * 10/1993   (JP) .

OTHER PUBLICATIONS

Patent Abstracts of Japan, vol. 018, No. 033 (E–1493), Jan. 18, 1994 & JP 05 266993 A (Hitachi Ltd), Oct. 15, 1993.
Marito Matsuoka, et al: "A Few Techniwues for Preparing Conductive Material Films for Sputtering–Type Electron Cyclotron Resonance Microwave Plasma" Japanese Journal of Applied Physics, vol. 28, No. 3, Mar. 1, 1989, pp. L503–506, colonne de gauche, alinéa 1, figure 4.
Berry L A, et al.: "Permanent Magnet Electron Cyclotron Resonance Plasma Source With Remote Window" Journal of Vacuum Science and Technology: Part A, vol. 13, No. 2, Mar. 1, 1995, pp. 343–348, XP000498541, p. 343, colonne de droite, alinéa 2, figure 1.
Patent Abstracts of Japan, vol. 012, No. 438 (C–544), Nov. 17, 1988 & JP 63 162865 A (Matsushita Electric Ind. Co Ltd.), Jul. 6, 1988.

* cited by examiner

Primary Examiner—Rodney G. McDonald
(74) Attorney, Agent, or Firm—Burns Doane Swecker & Mathis LLP

(57) ABSTRACT

A linear microwave plasma source comprises a leaktight chamber (10) under negative pressure and a microwave injection guide (12) that ends in a 90° elbow (13) opening perpendicularly into the chamber, a leaktight microwave window (15) being placed between the microwave injection guide (12) and the 90° elbow (13) such that they cause ionization of the gas in a zone (35) of electron cyclotron resonance located a few centimeters inside the elbow (13) that is under negative pressure. First and second permanent magnets (13, 17) are disposed on either side of said window (15), said magnets (16, 17) being installed with alternating polarity. A sputtering target (21) is located inside the plasma stream and electrically insulated from the chamber and charged with a negative polarity, and means (27) for injecting gas for controlling the ionic species of the plasma stream are provided.

6 Claims, 4 Drawing Sheets

PERMANENT MAGNET LINEAR MICROWAVE PLASMA SOURCE

FIELD OF THE INVENTION

The present invention relates to a permanent magnet electron cyclotron resonance plasma source for treating or coating surfaces by sputtering.

BACKGROUND ART

In an electron cyclotron resonance source, ions are obtained by ionizing a gaseous medium composed of one or more gases or metallic vapors in an enclosed chamber such as a hyperfrequency cavity. This ionization is the result of an interaction between the gaseous medium and a number of electrons that have been highly accelerated by electron cyclotron resonance. This resonance is obtained by combining a microwave electromagnetic field injected into the chamber with a magnetic field obtaining in the said chamber.

Electron cyclotron resonance can be used to create dense plasmas at low pressure without using filaments or cathodes. In an embodiment described in reference document No. 1 (see end of description), an electron cyclotron resonance source composed of two rectangular wave guides is used to produce a powerful flow of ions for use in synthesizing materials by sputtering.

Injecting a micro-wave source at a frequency of 2.45 GHz into a plasma chamber comprising a zone of electron cyclotron resonance at 0.0875 Tesla causes ionization of a gas under low pressure at $10^{-4}$ to $10^{-3}$ mbar. The ions and electrons thereby created are diffused along the lines of the magnetic field until they reach a negatively-charged target. Sputtering is carried out at −500 Volts on silicon or quartz substrates. The height of the plasma is 20 cm at a width of 5 cm. Electron densities measured by interferometer at 27 GHz reach $4 \times 10^{11}$ e/cm$^3$ for argon and krypton. The density of the ion current is 40 mA/cm$^2$ for oxygen plasma.

In contrast with magnetrons, the independence of the plasma gun from the target makes it possible to give continuous production of a wide range of deposits:

- layers of magnetic material (iron) on quartz have been obtained at a speed of 200 nm/min (nanometers/minute) at low pressure;
- using reactive sputtering of oxygen and nitrogen plasmas, it has been possible to created oxide layers of transparent $Al_2O_3$ and stoichiometric $Cr_2O_3$, and nitride layers of AlN at speeds of 10 to 20 nm/min; using a suitable argon-oxygen mixture to overcome the problem of oxidation of the target with aluminum it is possible to achieve speeds of 100 nm/min. Unlike magnetrons, the procedure requires no RF polarization supply. A simple DC power supply can be used to carry out all deposits;
- low pressure deposits ($10^{-4}$ mbar) reduce the proportion of gas included in the layers and induce increased density of the material (approximately 7 g/cm$^3$ for chrome deposits on silicon);
- diamond-type carbon layers have been achieved by sputtering a carbon target using a polarized substrate or methane dissociation;
- unlike magnetrons, target wear is uniform for the entire sputtered surface.

For several decades, electron cyclotron resonance plasma sources have been widely used for synthesizing materials. Particularly in Japan and the USA, special attention has been devoted to sputtering using electron cyclotron resonance plasmas and several types of equipment have been constructed depending on the type of material and the size of the substrate. A description and brief bibliography are given in reference document No. 1 (see end of description).

The most commonly used electron cyclotron resonance microwave sources for deposition by sputtering consist of a cylindrical plasma chamber, magnetic field coils that create an absorption zone at 875 Gauss and enable the plasma to be diffused onto a negatively-polarized target. The main drawbacks of these sources is that they require solenoids that have a high level of power consumption, they use cylindrical sputtering targets on the periphery of the plasma giving a low level of interaction between the plasma and the target, and the microwave leaktight windows have a tendency to be obliterated by sputtered metal atoms. Sources of this type are described in reference documents 2, 3 and 4.

Electron cyclotron resonance plasma apparatuses have been constructed using permanent magnets fastened to a 90° microwave injection elbow and a wave absorption zone located inside a conical sputter target. The main drawback of these apparatuses is the fact that the microwave window is located near the sputtering zone and very quickly obliterated. Moreover, deposition speeds are limited. This type of apparatus is described in reference document 5.

Permanent magnet electron cyclotron resonance plasma sources have been developed in Japan using slot-guided microwave injection systems (slot antennas). The main drawbacks of these sources are the limited power of the injected microwaves and the ensuing limited ionic density at approximately 10 mA/cm$^2$, together with obliteration of the microwave windows. This type of source is described in reference document 6.

Electron cyclotron resonance plasmas have been created using the magnetic structures of magnetrons by alternating the polarity of the permanent magnets behind the sputter target and then injecting a microwave source. The main drawbacks of these structures are the difficulty in sputtering magnetic materials due to the target forming a barrier, the uneven target wear (targets become unusable once 30% worn) and the oxidation of the target to produce oxides (RF polarization). These types of structures are described in reference documents 7 and 8.

Electron cyclotron resonance apparatuses have been developed using a sputter target inside the diffusion plasma (at an angle of 45°) with two solenoid assemblies together with a strongly magnetic microwave window, the creation of an 875 Gauss absorption zone, and diffusion and compression of the plasma on the target; this produces powerful flow of ions at low pressure (25 to 30 mA/cm$^2$ at $10^{-4}$ mbar on extrapolated surfaces. Tests of this system were carried out using two wave guides for a height of 20 cm. A microwave window is located in a 90° elbow where it is protected from metallic deposition. The drawbacks of these apparatuses are the high power consumption of the solenoids and the angle of the target relative to the substrate. This type of apparatus is described in reference documents 1 and 9.

It is the aim of the present invention to overcome the drawbacks of the apparatuses of the prior art described above.

DISCLOSURE OF THE INVENTION

The present invention relates to a linear microwave source comprising:
- a leaktight chamber;
- means for creating a magnetic field in the chamber and for generating a plasma stream;
- means for coupling the microwave source to the plasma stream inside the chamber;

a sputtering target that is located inside the plasma stream and electrically insulated from the chamber and charged with negative polarity;

pump means for creating negative pressure inside the chamber;

means for injecting gas for controlling the ionic species of the plasma stream such that the ions accelerated towards the target cause ejection of sputtered atoms onto a substrate;

characterized by the fact that the said coupling means comprise a microwave injection guide followed by a 90° elbow opening perpendicularly into the chamber, a leaktight microwave window located between the microwave injection guide and the 90° elbow such that they cause ionization of the gas in a zone of electron cyclotron resonance located a few centimeters inside the elbow and under negative pressure, and by the fact that the means for creating a magnetic field comprise first and second permanent magnets disposed either side of said window, said magnets being installed with alternating polarity.

The target is advantageously cooled by means of a cooling circuit comprising pipes that supply and drain liquid coolant.

In a first embodiment a third magnet is disposed on the opposite side of the chamber from the first magnet and at the same height as the said first magnet, the poles of the first and third magnets being disposed in series.

In a second embodiment the third magnet is disposed behind the target, the poles of the first and third magnets being disposed in series.

The target may be advantageously disposed parallel to the substrate. The microwave admission guide may be disposed so that its height increases from its inlet to its outlet that is connected to the microwave window.

The source of microwave plasma deposition of the invention has numerous advantageous features that give it high performance characteristics:

the leaktight microwave window is located in front of a 90° elbow which prevents it being coated with metal;

the leaktight microwave window is located in a magnetic field that is stronger than that of the electron cyclotron resonance (ECR); when the microwaves pass through the first zone of electron cyclotron resonance under atmospheric pressure (ECR1) they do not trigger any unwanted plasma and absorption takes place as desired under negative pressure in the negative pressure electron cyclotron resonance zone (ECR2);

the static magnetic field B and wave propagation k just before and inside the second zone ECR2 are parallel, thereby avoiding any cutoff effect and avoiding limitations on plasma density;

the absorption zone ECR2 is located a few centimeters inside the 90° elbow, giving a high microwave density (when absorption occurs in a small volume density is greater) and consequent high plasma densities; it is thus possible, using a large volume and low density, to avoid zone ECR2 being located outside the elbow in the deposition chamber;

the target and the substrate may be disposed parallel to one another, thereby making it possible to obtain uniform deposition of a layer on the substrate. Moreover, given that the electron cyclotron resonance zone (i.e. the plasma chamber) is located inside the elbow, the plasma turns and arrives on the substrate parallel to the said substrate;

the small cross section of the electron cyclotron resonance zone means that for a given power rating, the power density is very great. This configuration makes it possible to operate at a low microwave power (of the order of a few tens of Watts) and under very low pressure (of the order of a few $10^{-5}$ mbar);

the height of the plasma may be increased to allow deposition on larger surfaces; this is a significant advantage compared with sources that use coils;

in contrast with magnetrons, target wear is uniform over the entire surface.

The source of the invention is suitable for applications relating to sputter-deposition of thin films of magnetic and non-magnetic metals, oxides, nitrides and carbides, etc. at between $10^{-5}$ to $10^{-2}$ mbar, deposition of graphite or diamond carbon with hydrocarbons or the treatment of extrapolated linear surfaces.

DETAILED DISCLOSURE OF EMBODIMENTS OF THE INVENTION

Figure 1:
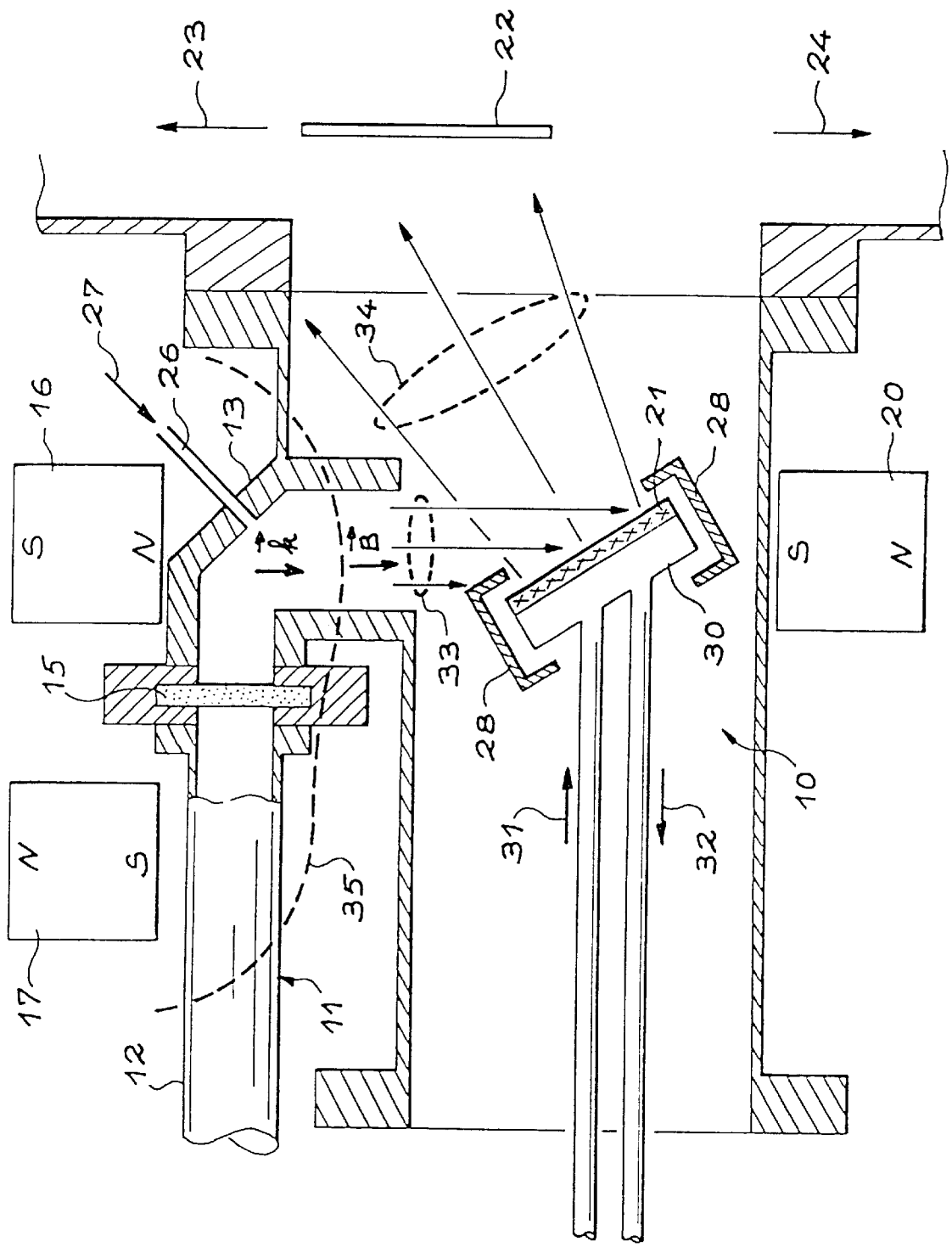
FIG. 1 is a top view of a first embodiment of the plasma source of the invention.

The plasma source of the invention consists of a vacuum chamber 10, a set of permanent magnets 16, 17, 20 that create a given magnetic configuration and generate a plasma stream inside the chamber, and a coupler 11 that distributes inside the chamber the microwaves generated by one or more microwave emitters. Injecting microwaves into the chamber 10 causes ionization of a gas under low pressure. The gas 27 is injected by means of piping 26.

Coupler 11 has a longitudinal axis (extending right to left in FIG. 1) and comprises a microwave injection guide 12 that ends in a 90° elbow 13 that is connected perpendicularly to chamber 10. A leaktight microwave window 15, constructed of quartz, for example, is disposed between the inlet microwave guide 12 and elbow 13.

Figure 2:
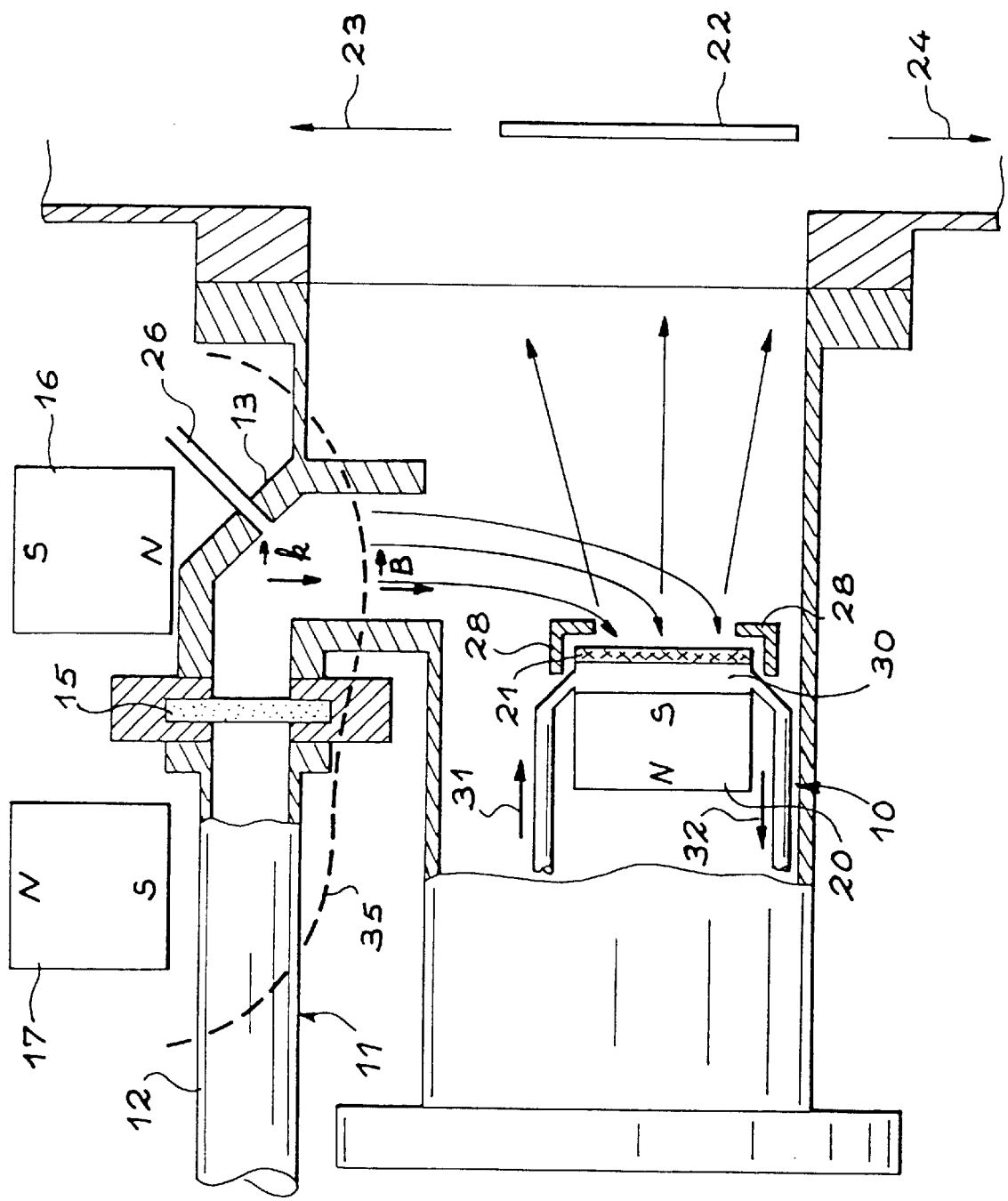
FIG. 2 is a top view of a second embodiment of the plasma source of the invention.

The electron cyclotron resonance zone is shown by a dotted line 35 in FIGS. 1 and 2; the value of the resonance being ECR1 in microwave injection guide 12, which is a guide under atmospheric pressure, and ECR2 in elbow 13, which is under negative pressure, the arrow 24 indicating pumping of the chamber 10.

A sputter target 21 that is of negative polarity relative to the mask outside the ground 28 is located inside the diffusion plasma. This target is cooled by means of a cooling circuit 30 comprising pipes that supply 31 and drain 32 the liquid coolant, for example water.

Sputter target 21 may rotate to give a parallel target-substrate configuration if required.

The substrate 22 to be coated or treated is located at the end of chamber 10; the substrate moves, for example, on rectilinear displacement means 23 as shown in FIGS. 1 and 2.

First and second permanent magnets 16 and 17 are disposed on either side of window 15. Said magnets 16 and 17 are installed with alternating polarity, i.e. poles N–S alternate with poles S–N as shown in FIGS. 1 and 2.

First magnet 16 creates a magnetic field B parallel to the wave propagation k. It creates a module field ECR2 in elbow 13 located downstream and extending to the desired point. When combined with second magnet 17 it creates a strong field around window 15. Microwave elbow 13 ensures that window 15 is positioned at 90° to the axis of the plasma.

As can be seen from FIG. 1, in a first embodiment of the invention a third magnet 20 is disposed on the other side of chamber 10 at the same height as first magnet 16, first and third magnets 16 and 20 being disposed with their poles in series N–S or S–N).

Said third magnet 20 is used to draw the lines of the field onto target 21, thereby increasing the ionic sputtering density. The lines of the magnetic field converge on target 21 to give the highest possible density of ions on the target; plasma diffusion 33 follows the lines of the magnetic field and the current density is approximately proportional to the magnetic field (magnetic flux and total current are constant throughout deposition). If the third magnet 20 did not influence the flow, the lines of the field would diverge and the plasma density would be reduced.

Injecting microwaves into the wave guide 12 via the leaktight window 15 causes ionization of the gas in the electron cyclotron resonance zone 35 (electron cyclotron resonance, for example at 875 Gauss) located a few centimeters inside elbow 13 under negative pressure. Said 90° elbow protects window 15 from being coated with metal which would cause the incident microwaves to be reflected. The plasma thereby created is diffused along the lines of the magnetic field until it reaches target 21 that is negatively charged, typically at −100 to −1,000 V. The ions accelerated onto target 21 cause sputtered atoms to be ejected onto the substrate 22 in a flow 34.

In a second embodiment (shown in FIG. 2) the third magnet 20 is disposed behind the target 21. In this configuration the poles of first and third magnets 16 and 20 are disposed in series (N–S or S–N).

For example, in a first embodiment shown in FIG. 1, target 21 may be set at an angle so that the lines of the field are parallel to the outlet wave guide, the poles of the first and second magnets are disposed in N–S or S–N series and, in a second embodiment shown in FIG. 2, the target 21 may be parallel to the substrate, the lines of the field being curved by the third magnet located behind the target.

Figure 3:
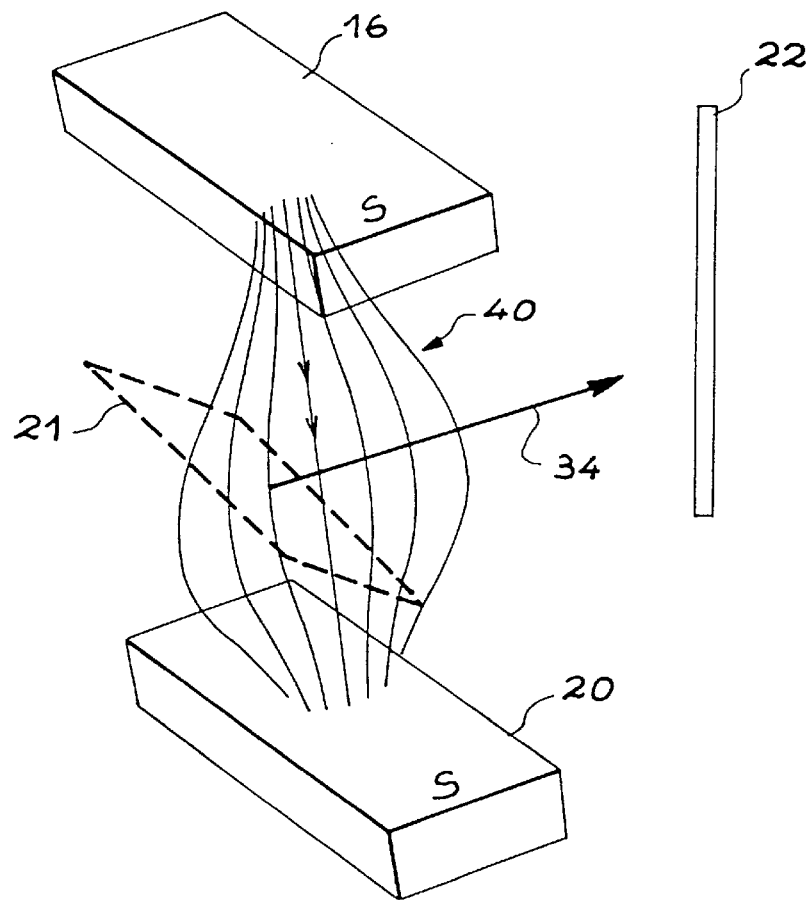
FIGS. 3 and 4 show a detail of the curvature of the lines of force in the first and second embodiments respectively of the plasma source of the invention.
Figure 4:
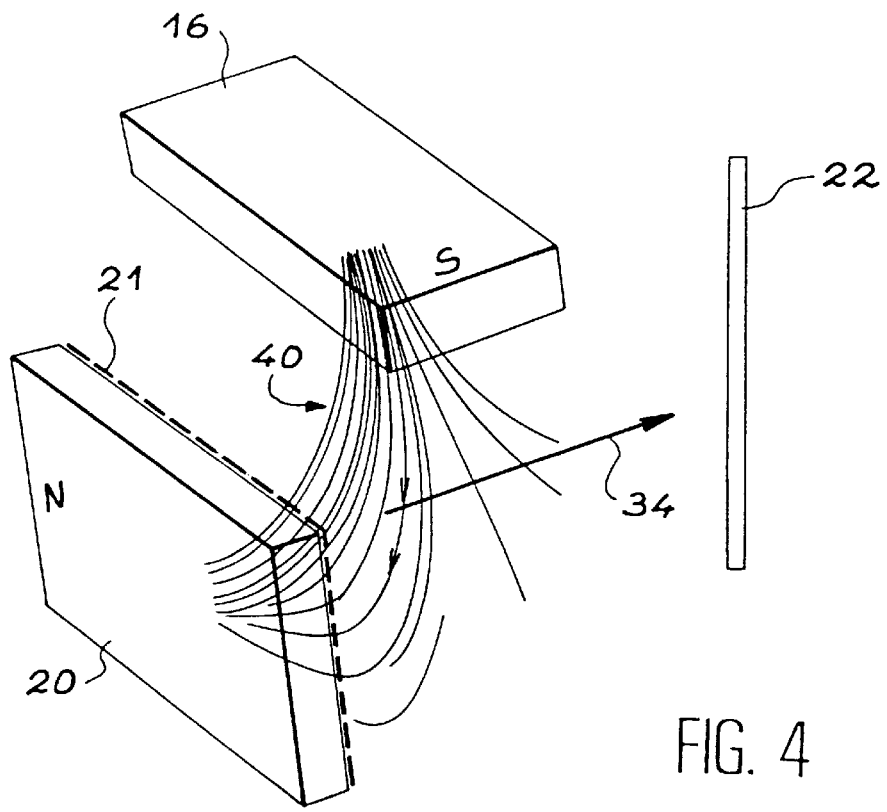

FIGS. 3 and 4 show details of the curvature of the lines of field 40 for the first and second embodiments respectively.

Figure 5A:
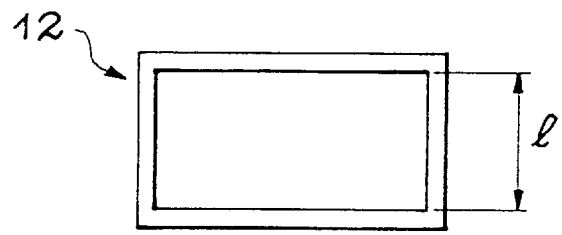
FIGS. 5A and 5B respectively show front and side views of a version of an embodiment of the microwave injection guide connected to the plasma source of the invention.
Figure 5B:
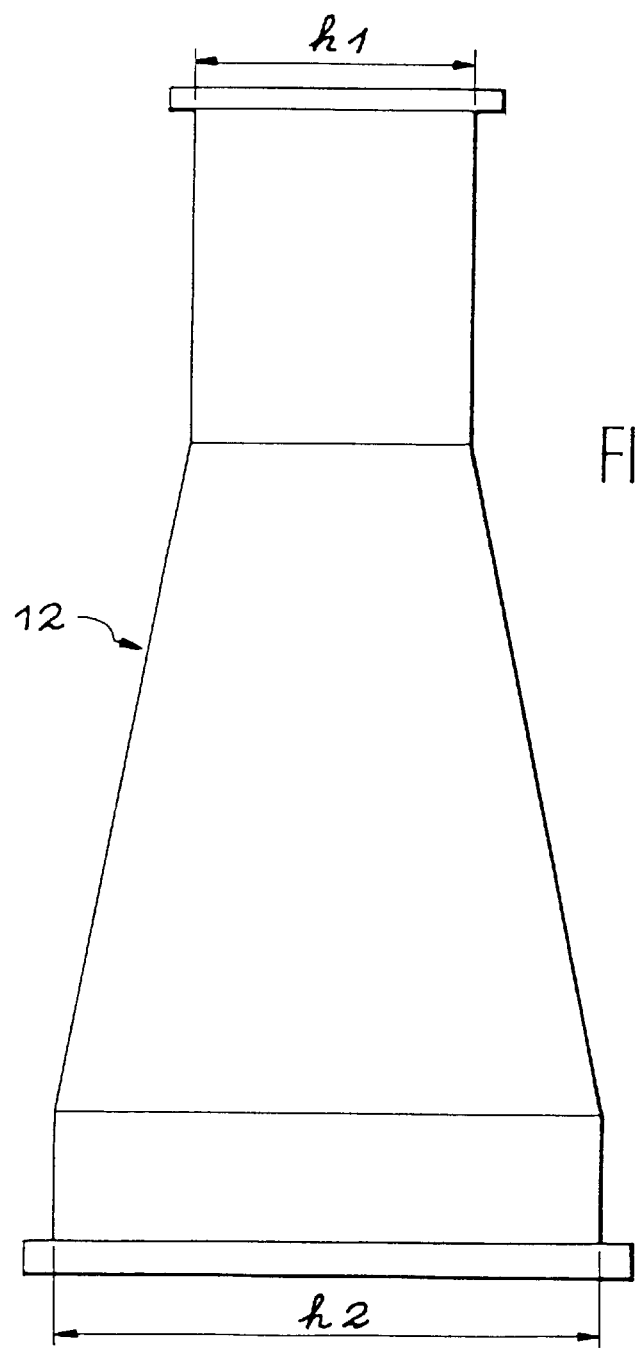

The height of the plasma may be increased by increasing the height of microwave injection 12 by the guide by adding an extension to the guide as shown in FIG. 5. In this version the microwave injection guide 12 has a height h2 that is one side of the microwave window 15 shown in FIGS. 1 and 2 and a height h1 of one side of a microwave emitter bore. This guide may be WR 340 or similar for a wave frequency of f=2.45 GHz with the following measurements: h1=86 mm, h2=172 mm, l=43 mm.

REFERENCES

1. "Electron Cyclotron Resonance Microwave Plasma-Based Technique for Sputter-Deposition and Chromium Films" by E. Touchais, M. Delaunay and Y. Pauleau (Proceedings of the 5the International Symposium on Trends and New Applications in Thin Films, Colmar, France, Apr. 1–3 1996 and thesis by E. Touchais, Institut National Polytechnique de Grenoble, France, 23 July 1996).

2. "Electron Cyclotron Resonance Plasma Deposition Technique Using Raw Material Supply by Sputtering" by T. Ono, C. Takahashi and S. Matsuo (Japan J. Appl. Phys. 23, L534, 1984).

3. Oxide Film Deposition by Radio Frequency Sputtering with Electron Cyclotron Resonance Plasma Stimulation by N. Matsuoka and S. Tohno (J. Vac. Sc.

Teohnol. A13, 2427, 1995).

4. "A Few Techniques For Preparing Conductive Material Films For Sputtering-Type Electron Cyclotron Resonance Microwave Plasma" by M. Matsuoka and K. Ono (Japan J Appl. Phys. 28, L503, 1989).

5. "Permanent Magnet Electron Cyclotron Resonance Plasma Source With Remote Window" by L. A. Berry and S. M. Gorbatkin (J. Vac. Sci. Technol. AI3, 343, 1995).

6. "Long Electron Cyclotron Resonance Plasma Source for Reactive Sputtering" by T. Yasui, K. Nakase, H. Tahara and T. Yoshikawa (Japan J. Appl. Phys. 35, 5495, 1996).

7. "Microwave-Enhanced Magnetron Sputtering" by Y. Yoshida (Rev. Sci. Instrum. 63, 179, 1992).

8. "Highly Homogeneous Silica Coatings for Optical and Protective Applications Deposited by PECVD at Room Temperature in a Planar Uniform Distributed Electron Cyclotron Resonance Plasma Reactor" by J. C. Rostaing, F. Coeuret, J, Pelletier, T. Lagarde and E. Etemadi (Thin Solid Films 270, 1995, pages 49–54).

9. French patent No. FR-2 701 797 (application Ser. No. 93 01847 dated Feb. 18, 1993) by G. Briffod and T. K. Nguyen, "Coupleur de transfert d'une puissance micro-onde vers une nappe de plasma et source micro-onde lineaire pour le traitement de surfaces par plasma" (Transfer coupler of a microwave source to a plasma beam and linear microwave source for plasma-treatment of surfaces).

What is claimed is:

1. Linear microwave plasma source comprising:

a leaktight chamber;

means for creating a magnetic field in the leaktight chamber and for generating a plasma stream;

means for coupling a microwave source to the plasma stream inside the chamber, the means for coupling having a longitudinal axis;

a sputtering target that is located inside the plasma stream and electrically insulated from the leaktight chamber and charged with negative polarity;

pump means for creating negative pressure inside the leaktight chamber;

means for injecting gas for controlling the ionic species of the plasma stream such that ions accelerated onto the sputtering target cause ejection of sputtered atoms onto a substrate to be treated, wherein said means for coupling comprises a microwave injection guide followed by a 90° elbow opening perpendicularly into the leaktight chamber, a leaktight microwave window being located between the microwave injection guide and the 90° elbow such that ionization of gas in a zone of electron cyclotron resonance located at least partially inside the 90° elbow is caused under negative pressure, and wherein the means for creating a magnetic field comprises first and second permanent magnets disposed on either side of said leaktight microwave window, said first and second permanent magnets being installed with alternating polarity and having N–S axes which are perpendicular to the longitudinal axis of the means for coupling.

2. Source of claim 1 wherein the sputtering target is cooled by means of a cooling circuit comprising pipes that supply and drain liquid coolant.

3. Source of claim 1 wherein a third magnet is disposed on an opposite side of the leaktight chamber from the first magnet and at the same height as the first magnet, the poles of the first and third magnets being disposed in series.

4. Source of claim 1 wherein a third magnet is disposed behind the sputtering target, the poles of the first and third magnets being disposed in series.

5. Source of claim 1 wherein the sputtering target is disposed parallel to the substrate.

6. Source of claim 1 wherein the microwave injection guide has an inlet and an outlet and is disposed so that its height increases from said inlet to said outlet that is connected to the microwave window.

* * * * *